(12) United States Patent
Mahajan et al.

(10) Patent No.: US 10,482,205 B2
(45) Date of Patent: Nov. 19, 2019

(54) LOGIC ANALYZER FOR INTEGRATED CIRCUITS

(71) Applicant: Xilinx, Inc., San Jose, CA (US)

(72) Inventors: Akhilesh Mahajan, Hyderabad (IN); Bokka Abhiram Sai Krishna, Hyderabad (IN); Keshava Gopal Goud Cheruku, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/658,086

(22) Filed: Jul. 24, 2017

(65) Prior Publication Data

US 2019/0026416 A1 Jan. 24, 2019

(51) Int. Cl.
  *G06F 17/50* (2006.01)
  *G01R 31/3177* (2006.01)
  *G06F 11/25* (2006.01)

(52) U.S. Cl.
  CPC ..... *G06F 17/5031* (2013.01); *G01R 31/3177* (2013.01); *G06F 11/25* (2013.01)

(58) Field of Classification Search
  USPC ....................................... 716/108
  See application file for complete search history.

(56) References Cited

U.S. PATENT DOCUMENTS

| | | |
|---|---|---|
| 7,991,606 B1 | 8/2011 | D'Souza et al. |
| 9,495,492 B1 | 11/2016 | Ramabadran et al. |
| 2001/0037477 A1* | 11/2001 | Veenstra ............ G01R 31/3177 714/41 |
| 2003/0126490 A1 | 7/2003 | Litt et al. |
| 2007/0112544 A1 | 5/2007 | Browen et al. |
| 2009/0237110 A1 | 9/2009 | Lunzer et al. |
| 2010/0162046 A1* | 6/2010 | Dervisoglu ...... G01R 31/31705 714/27 |
| 2016/0011260 A1* | 1/2016 | Dervisoglu ....... G06F 17/30244 714/727 |

OTHER PUBLICATIONS

Dinigroup, "Successfully Debugging Complex FPGA Designs," Mar. 5, 2015, pp. 1-11, The Dini Group, La Jolla, California, USA.
Finchelstein, Daniel et al., "Debugging with ChipScope," MIT Class 6.111 Introduction to Digital Systems, Feb. 5, 2007, pp. 1-6, Massachusetts Institute of Technology, MTL Microsystems Technology Laboratores, Cambridge, Massachusetts, USA.
Xilinx, "Vivado Design Suite User Guide," UG908 (v2014.1), May 30, 2014, pp. 1-149, Xilinx, Inc., San Jose, California, USA.
Xilinx, "Integrated Logic Analyzer v5.0, LogiCORE IP Product Guide," PG172, Oct. 1, 2014, pp. 1-30, Xilinx, Inc., San Jose, California, USA.
Xilinx, Inc., WIPO Appln. PCT/US2018/041674, Written Opinion of the International Preliminary Examining Authority (PCT Rule 66), dated Jul. 2, 2019, 5 pg.

* cited by examiner

*Primary Examiner* — Mohammed Alam
(74) *Attorney, Agent, or Firm* — Kevin T. Cuenot

(57) ABSTRACT

Monitoring signals in an integrated circuit can include monitoring a probed signal of an integrated circuit using a logic analyzer circuit implemented within the integrated circuit, detecting state changes in the probed signal using the logic analyzer circuit, and generating, within the logic analyzer circuit, a file specifying time stamped state changes of the probed signal.

18 Claims, 3 Drawing Sheets

LOGIC ANALYZER FOR INTEGRATED CIRCUITS

TECHNICAL FIELD

This disclosure relates to integrated circuits (ICs) and, more particularly, to logic analyzers for monitoring signals within an IC.

BACKGROUND

A logic analyzer is an electronic system that is capable of monitoring one or more signals of another electronic system. In some cases, logic analyzers are available as cores that may be incorporated into a circuit design that is implemented within an integrated circuit (IC). In such cases, the logic analyzer and the circuitry and/or signals being monitored by the logic analyzer may be implemented within the same IC.

Typically, the logic analyzer samples values of monitored signals. The sampling rate typically coincides with the clock rate to capture the values of the signals at each clock cycle over time. The logic analyzer either stores the resulting data, e.g., the sampled values, within memory within the IC itself or attempts to output the data to another system. Due to the sampling rate, the number of signals being monitored, and the window of time over which signals are monitored, the logic analyzer generates a large amount of data. When this data is stored within the IC, a significant amount of memory is required. When this data is output from the IC, a significant amount of bandwidth is required. These constraints limit the window of time that signals may be monitored and/or limit the number of signals that may be monitored.

SUMMARY

One or more embodiments are directed to methods for monitoring signals in an integrated circuit (IC). In one aspect, a method can include monitoring a probed signal of an IC using a logic analyzer circuit implemented within the IC, detecting state changes in the probed signal using the logic analyzer circuit, and generating, within the logic analyzer circuit, a file specifying time stamped state changes of the probed signal.

One or more embodiments are directed to an IC. In one aspect, an IC includes monitored circuitry configured to generate a signal and a logic analyzer circuit. The logic analyzer circuit is configured to monitor the signal to detect state changes in the signal and generate a file specifying time stamped state changes of the signal.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
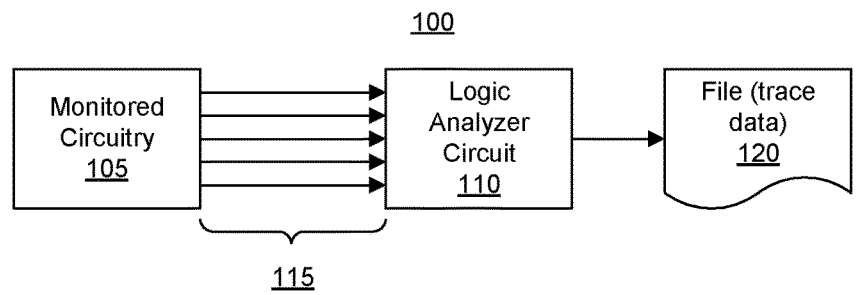
FIG. 1 illustrates an example integrated circuit (IC) including a logic analyzer circuit.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to logic analyzers for monitoring signals within an IC. The inventive arrangements described within this disclosure facilitate monitoring and analysis of internal signals of an IC. In one or more embodiments, a logic analyzer is implemented within an IC and is capable of monitoring one or more selected signals referred to as "probed signals." Further, the logic analyzer is capable of analyzing the probed signals within the IC itself.

In one or more embodiments, the logic analyzer is capable of detecting state changes of the probed signals. The logic analyzer is capable of determining a time stamp for each detected state change of a probed signal. The logic analyzer further is capable of generating a file specifying the time stamped state changes of the probed signals. The file is generated by the logic analyzer hardware within the IC itself. The logic analyzer is further capable of outputting the file to another circuit and/or system within the IC and/or to another circuit and/or system external to the IC.

Conventional logic analyzers attempt to continuously capture values of probed signals. The values are sampled, for example, at the clock rate of the system being monitored. The sampled values are stored and retained as traced data at least for the window of time for which logic analysis is to be performed. As such, the logic analyzer generates and stores significant amounts of trace data, e.g., a value for each probed signal at each clock cycle over the window of time that the probed signals are monitored. Capturing this amount of data requires significant memory resources on the IC for storing the data. This means that the logic analyzer becomes larger and more complex leaving fewer memory resources (and routing resources) available for implementing the electronic system being monitored.

Capturing large amounts of trace data also means that significant bandwidth is needed to offload the trace data from the IC in a timely manner. Often, conventional logic analyzers within ICs utilize the Joint Test Action Group (JTAG) interface to offload trace data from the IC. The JTAG interface, however, tends to be slow. The JTAG interface, for example, offloads trace data from the IC at a rate that is much slower than the rate at which trace data is generated. This means that additional memory resources of the IC, which may be scarce, are needed to implement the logic analyzer to store the trace data. This added complexity of the logic analyzer, in some cases, can reduce the maximum achievable operating frequency of a circuit design during synthesis, placement, and/or routing for implementation within the IC. In such cases, a circuit design with a conventional logic analyzer included therein operates at a slower frequency than had the conventional logic analyzer not been included.

The example embodiments described herein address these constraints and others by utilizing a file format that represents trace data as state change data. The file format is generated by, or within, the logic analyzer hardware itself. By generating the file in the logic analyzer hardware, the logic analyzer hardware, in effect, applies a form of compression to the trace data that is generated. For example, each sampled value of a probed signal need not be stored beyond the several clock cycles to detect state changes relative to the prior clock cycle. In addition, the resulting file is specified in a format that does not require proprietary decoding technology to access the trace data contained therein.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example IC 100 including a logic analyzer circuit. In the example of FIG. 1, IC 100 may be implemented as any of a variety of different types of IC. Examples include, but are not limited to, a digital IC, an application specific integrate circuit (ASIC), a programmable IC, a partially programmable IC, or other suitable IC. Examples of programmable and/or partially programmable ICs include, but are not limited to, field programmable gate arrays (FPGAs), programmable logic arrays (PLAs), complex programmable logic devices (CPLDs), and/or other ICs that include one or more programmable circuit blocks, programmable circuit tiles, or other programmable circuitry.

As pictured, IC 100 includes monitored circuitry 105. Monitored circuitry 105 is coupled to logic analyzer circuit 110. More particularly, one or more wires 115, or interconnects, couple monitored circuitry 105 and logic analyzer circuit 110. Each of wires 115 carries a monitored signal. For purposes of discussion, the signals conveyed by wires 115 are referred to herein as "probed signals."

Monitored circuitry 105 may be implemented as any circuitry that includes, or generates, signals that are to be monitored (e.g., probed signals). In one or more embodiments, monitored circuitry 105 is user-specified circuitry. For example, monitored circuitry 105 may include circuitry that is implemented as part of a user circuit design. In the case of a programmable IC, monitored circuitry 105 may be wholly or partially implemented using programmable circuitry of the IC.

In one or more embodiments, logic analyzer circuit 110 is implemented as a hardwired circuit within IC 100. In one or more other embodiments, logic analyzer circuit 110 is implemented within programmable circuitry of the IC. For example, logic analyzer 110 may be provided as a core, parameterizable portion of circuitry or core, or predefined unit of circuitry that may be incorporated into a user circuit design that includes monitored circuitry 105. In the latter case, when implemented in programmable circuitry, logic analyzer circuit 110 may have a user selectable number of probe ports. Each probe port may have a user selectable probe width.

In any case, logic analyzer circuit 110 is not implemented as a processor that executes program code. Rather, logic analyzer circuit 110 is circuitry that is dedicated for performing the operations described herein whether implemented as hardwired or hardened circuitry, in programmable circuitry, or a combination of hardened circuitry and programmable circuitry.

Logic analyzer circuit 110 is capable of receiving probed signals carried by wires 115. Logic analyzer circuit 110 further is capable of analyzing the probed signals. In one or more embodiments, logic analyzer circuit 110 is capable of detecting state changes on each of the probed signals received from monitored circuitry 105. For each detected state change, logic analyzer circuit 110 is capable of determining the time stamp that the detected state change occurred. In one or more embodiments, logic analyzer circuit 110 stores, at least temporarily, only time stamped state changes of probed signals as opposed to storing sampled signal values continuously regardless of any detected state change.

In one or more embodiments, logic analyzer circuit 110 is capable of detecting a trigger condition. A trigger condition is the occurrence of a particular or predetermined state on one or more of the probed signals. Logic analyzer circuit 110 is capable of monitoring the states of the probed signals and, in response to detecting a predetermined state on a probed signal or predetermined states on a plurality of probed signals corresponding to a trigger condition, initiate an action associated with the trigger condition. In an example, logic analyzer circuit 110 is capable of abstaining from generating file 120 until a particular trigger condition is detected. In response to detecting the trigger condition, logic analyzer circuit 110 is capable of generating file 120 or starting to generate file 120 to output trace data. Multiple probe ports of logic analyzer circuit 110 may be combined, e.g., monitoring of the signals thereon, into a single trigger condition.

In one or more embodiments, logic analyzer circuit 110 is capable of outputting trace data for the probed signals as a file 120. File 120 may specify state change data for the probed signals and the time stamps for the state change data. For example, file 120 may specify each state change and a time stamp for such state change for each of probed signal.

In the example of FIG. 1, file 120 is generated in hardware. Logic analyzer circuit 110 generates file 120. In one or more embodiments, file 120 is encoded using American Standard Code for Information Interchange (ASCII). As an illustrative and non-limiting example, file 120 is implemented as a value change dump (VCD) file. In one or more embodiments, file 120 is compliant with IEEE Standard 1364-1995. In one or more embodiments, file 120 is compliant with IEEE Standard 1364-2001.

Listing 1 illustrates an example of file 120. Listing 1 is formatted in ASCII as a VCD file.

Listing 1

$date Sept 10 2008 12:00:05 $end
version Example Simulator V0.1 $end
$timescale 1 ns $end
$scope module top $end
$var wire 32 ! data $end
$var wire 1 @ en $end

```
$var wire 1 # rx $end
$var wire 1 $ tx $end
$var wire 1% err $end
$var wire 1 ^ ready $end
$upscope $end
$enddefinitions $end
#0
b10000001 !
0@
1#
0$
1%
0^
#1
1@
#2
0@
#3
1@
#5
1@
#11
b0
0#
#16
b1010101010101101010101010101 !
1#
#20
0%
#23
. . .
```

By generating trace data as an ASCII formatted file and also as a VCD file, the trace data may be easily viewed and rendered by any of a variety of systems without any further processing. A VCD file, for example, may be provided directly to a VCD waveform viewer. VCD waveform viewers are readily available and, for example, may be implemented within a standard browser without having to perform any special and/or proprietary decoding of the trace data.

In particular embodiments, logic analyzer circuit 110 is capable of continuing to output file 120 as a data stream over the time period that logic analyzer circuit 110 is monitoring the probed signals. Logic analyzer circuit 110 is capable of outputting file 120 in real time or in substantially real time with the analysis performed therein. Accordingly, in one or more embodiments, logic analyzer circuit 110 is not limited or constrained by the amount of on-chip memory of IC 100.

In accordance with the inventive arrangements described herein, logic analyzer circuit 110 is capable of monitoring a large number of signals without storing trace data for each monitored signal for each clock cycle. As an illustrative example, a user may specify that logic analyzer 110 is to be implemented in programmable circuitry of an IC and is to monitor 1,000 signals of monitored circuitry 105. Rather than store the value of each of the 1,000 probed signals each clock cycle as the trace data, logic analyzer need only store the state change of each event with the time stamp of the state change as the trace data. Given a known initial state of a probed signal, the resulting trace data in file 120 indicates the value of each probed signal at any given time that the probed signal is monitored. Recording state change allows the logic analyzer to utilize fewer memory resources (e.g., use fewer block random access memories) than is the case with conventional logic analyzers.

Figure 2:
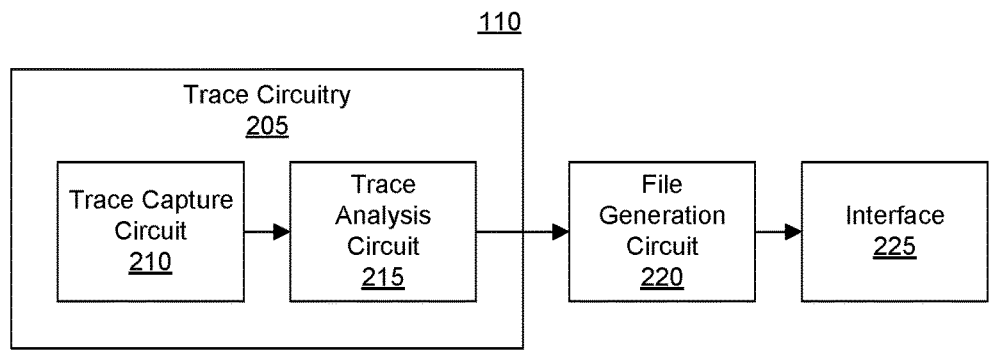
FIG. 2 illustrates an example implementation of a logic analyzer circuit.

FIG. 2 illustrates an example implementation for logic analyzer circuit 110 of FIG. 1. In the example of FIG. 2, logic analyzer circuit 110 includes trace circuitry 205, a file generation circuit 220, and an interface 225. Trace circuitry 205 may include a trace capture circuit 210 and a trace analysis circuit 215.

Trace capture circuit 210 is coupled to wires 115 (not shown). Trace capture circuit 210 is capable of receiving each of the probed signals. In one or more embodiments, trace capture circuit 210 is capable of buffering the values of the probed signals. In one or more embodiments, trace capture circuit is capable of capturing, or storing, a current value of each probed signal (e.g., for a current clock cycle) and a prior value of each probed signal (e.g., from the clock cycle immediately prior to the current clock cycle).

Trace analysis circuit 215 is capable of performing analysis on the probed signals. In one or more embodiments, trace analysis circuit 215 is capable of determining whether a state of each probed signal has changed. For example, for each probed signal, trace analysis circuit 215 determines whether the value of the probed signal has transitioned from zero to one or from one to zero. Trace analysis circuit 215 is capable of receiving the current value and the prior value of each probed signal from trace capture circuit 210 and performing a comparison to determine whether the current value of each probed signal is different than the prior value of the probed signal.

In the example of FIG. 2, trace analysis circuit 215 is capable of outputting trace data. The trace data specifies which of the probed signals has changed state and a time stamp for each such change in state of a probed signal. As shown, file generation circuit 220 is coupled to an output of trace analysis circuit 215. Accordingly, file generation circuit 220 receives the trace data.

File generation circuit 220 is capable of generating a file specifying the trace data. In one or more embodiments, file generation circuit 220 is capable of generating an ASCII encoded file. The ASCII encoded file may be a VCD file or another suitable file type. Thus, rather than storing the value of each probed signal over time as trace data (e.g., during the entire time that logic analyzer 110 is active and monitoring probed signals), logic analyzer 110 is capable of detecting and storing state changes of the probed signals as part of generating file 120.

As discussed, in particular embodiments, logic analyzer circuit 110 is implemented in programmable circuitry of IC 100. As part of implementing a circuit design, for example, a user may specify which signals of the circuit design are to be monitored. An electronic design automation (EDA) system is capable of including an instance of logic analyzer circuit 110 within the user's circuit design, configuring logic analyzer circuit 110 to monitor the probed signals (specified by the user), and routing the probed signals to logic analyzer circuit 110 as part of an implementation flow (e.g., synthesis, placement, and routing).

As such, the EDA system is capable of generating logic analyzer circuit 110 and, more particularly, file generation circuit 220, to create and/or write various sections of file 120. Since logic analyzer circuit 110 is aware of the signals to be monitored, for example, file generation circuit 220 can be preconfigured to generate particular portions of file 120 such as the header section and the variable definition section. File generation circuit 220 includes the necessary circuitry to encode other data such as initial values and value changes (with time stamps) as such information is detected.

File generation circuit 220 outputs file 120 to interface 225. In one or more embodiments, file generation circuit 220 writes file 120 to a memory. In particular embodiments, the memory is implemented or included within file generation circuit 220. The memory may be implemented as a first-infirst-out (FIFO) memory or other type of memory circuit (e.g., buffer memory or RAM). Interface 225 is capable of reading file 120 from the memory and providing file 120 to another circuit and/or system. In one or more embodiments, interface 225 is capable of streaming file 120 to the circuit and/or system. For example, interface 225 is capable of outputting file 120 as file 120 is generated in real time or in substantially real time without waiting for file 120 to be generated in its entirety (e.g., for the end of the monitoring window).

In an example, interface 225 is implemented as an AMBA eXtensible Interface (AXI) bus. An AMBA AXI bus is an embedded microcontroller bus interface for use in establishing on-chip connections between circuit blocks and/or systems. For example, interface 225 may be implemented as an AXI stream interface, an AXI memory mapped interface, or another native interface of the IC. Other example implementations of interconnects or interfaces may include, but are not limited to, buses, cross-bars, and network on chips (NoCs).

In one or more embodiments, interface 225 is coupled to an input/output (I/O) circuit. The I/O circuit may be implemented as any of a variety of peripheral circuits and/or ports such as a gigabit transceiver, a Universal Serial Bus (USB) port, an Ethernet port, or other communication port implemented within the IC that allows the IC to provide file 120 to an external system. The I/O circuit may be a high speed communication interface thereby removing JTAG dependency from logic analyzer 110. In one or more other embodiments, interface 225 is coupled to a processor that is implemented within the IC. The processor may be one that is capable of executing program code. The processor may be hardwired within the IC or implemented using programmable circuitry included in the IC.

The example implementation of FIG. 2 facilitates low latency from the capture of trace data to the display of trace data by an external system. In particular embodiments, the example architecture described in connection with FIG. 2 supports live, e.g., real time or substantially real time, debugging of IC 100 from nearly any external data processing system despite location and proximity to IC 100. File 120, for example, may be rendered and displayed by an external system in real time as file 120 is generated and output from the IC and received by the external system.

In one or more embodiments, logic analyzer circuit 110 may be pipelined to facilitate the capture of clock signal data without any loss of data. In an example implementation, logic analyzer circuit 110 may include sufficient memory resources, e.g., block RAMs) to guarantee 512/1024 sample retention in case software capture (e.g., by a remote system) is not possible or there is a software fault.

Figure 3:
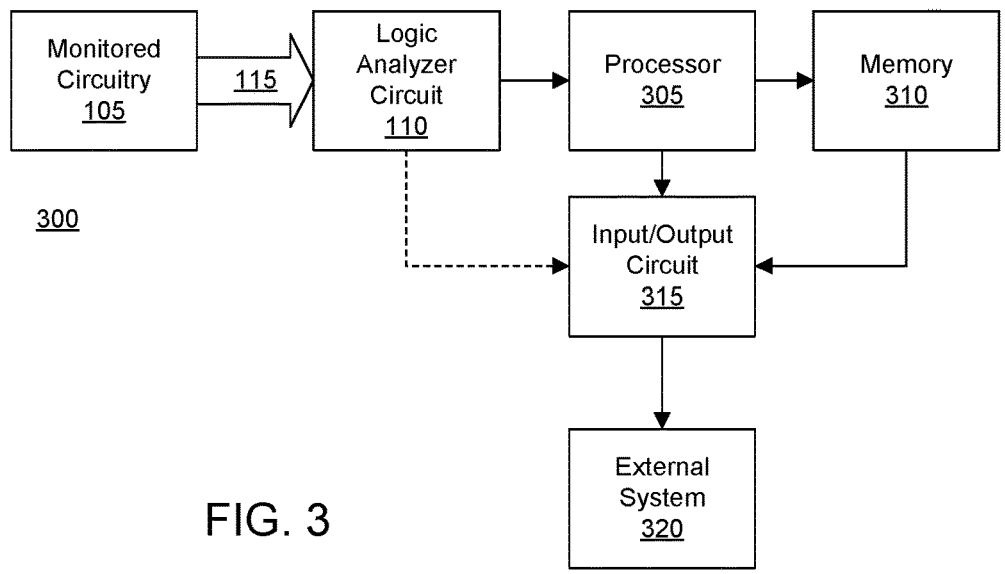
FIG. 3 illustrates another example IC including a logic analyzer circuit.

FIG. 3 illustrates another example IC 300 including logic analyzer circuit 110. In one or more embodiments, logic analyzer circuit 110 is coupled to a processor 305. Processor 305 is coupled to a memory 310 and an I/O circuit 315. In the example of FIG. 3, I/O circuit 315 may also be coupled to memory 310. Memory 310 may be any of a variety of different types of RAM. For example, I/O circuit 315 may be coupled to memory 310 via one or more direct memory access (DMA) circuits. Accordingly, processor 305 is capable of initiating output of the trace data file to external system 320 via I/O circuit 315.

In one or more embodiments, processor 305 is implemented using programmable circuitry of IC 300. In one or more embodiments, processor 305 is implemented as a hardwired processor of IC 300. Memory 310 may be implemented on-chip using programmable circuitry memory resources or as hardwired memory resources. In one or more other embodiments, memory 310 is implemented off-chip.

External system 320 may be a data processing system such as a computer system. For example, external system 320 may be a server. In one or more embodiments, IC 300 is included within a larger, more complex system and/or a remote environment such as a computer system within a data center and/or a server farm.

In embodiments where external system 320 is a data processing system, external system 320 is capable of executing a browser. In that case, the browser is capable of rendering the file received from logic analyzer 110 (e.g., the IC). For example, the browser or other application executed by external system 320 is capable of generating a visualization of the file showing waveforms. External system 320, for example, is capable of continuing to receive the file in substantially real time and generate waveforms specified by the file in substantially real time so that users are able to view the waveforms of the trace data in substantially real time as generated by file generation circuit 220.

In an illustrative example, processor 305 is capable of receiving a request to activate logic analyzer circuit 110 from external system 320. In response to the request, processor 305 is capable of activating logic analyzer circuit 110 and sending the file to a particular address or destination such as external system 320.

In one or more other embodiments, processor 305 is capable of executing a browser or other software that is capable of reading and/or processing file 120. Processor 305, for example, is capable of generating (or rendering) a waveform view of file 120. In that case, for example, I/O circuit 315 may be a video output port that may be provided or coupled to a monitor that displays the waveform(s) of file 120.

In particular embodiments, logic analyzer circuit 110 is coupled directly to I/O device 315 without utilizing and/or including processor 305. In that case, logic analyzer circuit 110 is capable of outputting the file generated therein directly to external system 320 by way of I/O circuit 315 without use or reliance upon processor 305 and/or memory 310.

Figure 4:
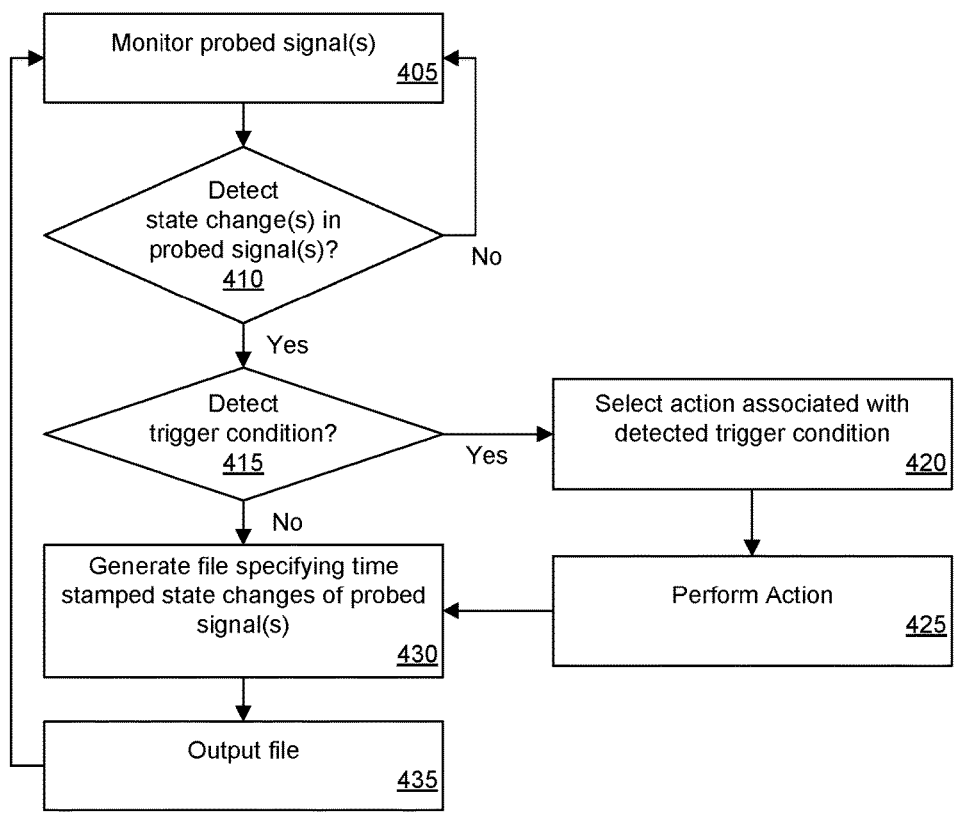
FIG. 4 illustrates an example method of generating trace data.

FIG. 4 illustrates an example method 400 of generating trace data. Method 400 may be performed by the logic analyzer circuit described in connection with FIGS. 1-3 of this specification. Method 400 may begin in a state where the logic analyzer circuit has been implemented within an integrated circuit. Further, probed signals of monitored circuitry such as a user circuit design have been routed and/or provided to the logic analyzer circuit for monitoring.

In block 405, the logic analyzer circuit begins monitoring probed signals. In block 410, the logic analyzer circuit determines whether a state change is detected on one or more or all of the probed signals. If the logic analyzer detects a state change on one or more or all of the probed signals, method 400 continues to block 415. If the logic analyzer does not detect a state change, method 400 loops back to block 405 to continue monitoring probed signals.

In block 415, the logic analyzer determines whether a trigger condition is detected. In one or more embodiments, a trigger condition is the existence of a particular value or state on one or more of the probed signals. If a trigger condition is detected, method 400 proceeds to block 420. If a trigger condition is not detected, method 400 continues to block 430.

In block 420, in the case where a trigger condition is detected, the logic analyzer selects an action that is associated with the particular trigger condition that is detected. For example, the logic analyzer may be capable of initiating a plurality of different actions. These different actions may be associated with different trigger conditions. Accordingly, the logic analyzer is capable of selecting an action from the plurality of actions based upon the particular trigger condition detected in block 415.

After block 420, method 400 continues to block 425. In block 425, the logic analyzer either initiates or performs the action selected in block 420.

Continuing with block 430, the logic analyzer generates a file specifying time stamped state changes of the probed signals. For example, the logic analyzer is capable of generating and ASCII encoded file. As noted, in one or more embodiments, the file may be a VCD file.

In one or more embodiments, the logic analyzer generates and/or encodes a header section of the file. The logic analyzer further can generate and/or encode a variable definition section of the file. The logic analyzer further can generate and/or encode an initial value section of the file. The initial value section of the file specifies the starting value or state of each of the probed signals. The logic analyzer further can generate a value change section. It should be appreciated that the logic analyzer circuit continues to generate the value change section so long as the logic analyzer continues to monitor the probed signals and detect state changes.

As an illustrative example, the logic analyzer circuit may generate the beginning portions of the file. The logic analyzer circuit continues to generate the value change section as further state changes in probed signals are detected. As the file is continuously generated by the logic analyzer circuit, the logic analyzer circuit is capable of outputting the file. Accordingly, in block 435 the logic analyzer circuit outputs the file. As discussed, outputting the file includes the case where the logic analyzer circuit generates a portion of the file and continues generating further portions of the file so that the file may be stream outputted from the logic analyzer circuit to another circuit and/or system or from the IC to another circuit and/or system external to the IC.

As discussed, in one or more embodiments, the file may be output to an external system. The external system is capable of generating a waveform view of the trace data. The external system may receive and display the waveform view in substantially real time. For example, the external system is capable of generating a waveform view within one approximately one second of capturing the probed signal.

Figure 5:
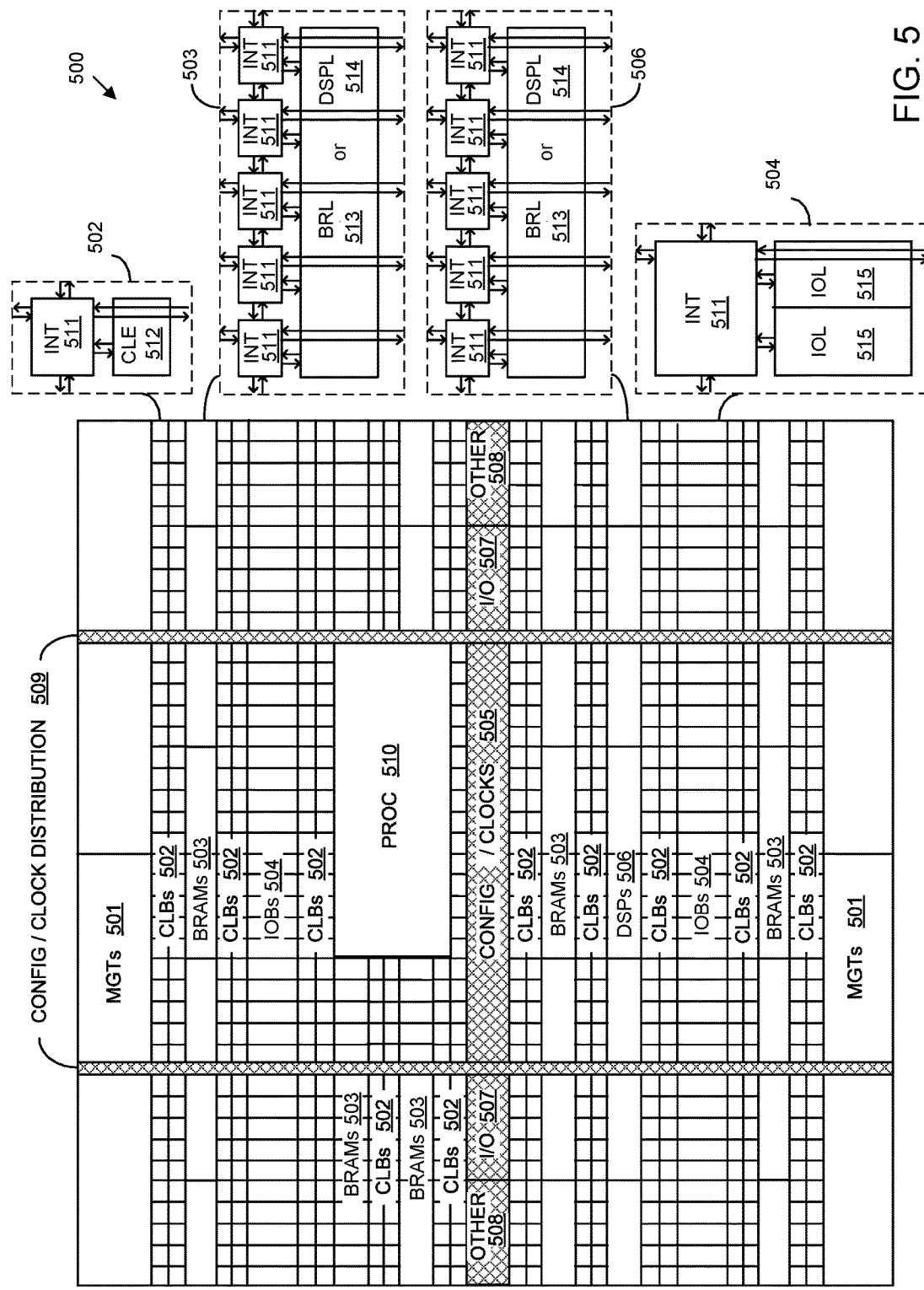
FIG. 5 illustrates an example architecture for an IC.

FIG. 5 illustrates an example architecture 500 for an IC. In one aspect, architecture 500 may be implemented within a programmable IC. For example, architecture 500 may be used to implement an FPGA. Architecture 500 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor. In one or more embodiments, monitored circuitry 105, logic analyzer circuit 110, processor 305, memory 310, and/or I/O circuit 315 may be implemented in an IC having an architecture that is the same as, or similar to, that of FIG. 5.

As shown, architecture 500 includes several different types of programmable circuit, e.g., logic, blocks. For example, architecture 500 may include a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized I/O blocks 507 (e.g., configuration ports and clock ports), and other programmable logic 508 such as digital clock managers, analog-to-digital converters, system monitoring logic, and so forth.

In some ICs, each programmable tile includes a programmable interconnect element (INT) 511 having standardized connections to and from a corresponding INT 511 in each adjacent tile. Therefore, INTs 511, taken together, implement the programmable interconnect structure for the illustrated IC. Each INT 511 also includes the connections to and from the programmable logic element within the same tile, as shown by the examples included at the top of FIG. 5.

For example, a CLB 502 may include a configurable logic element (CLE) 512 that may be programmed to implement user logic plus a single INT 511. A BRAM 503 may include a BRAM logic element (BRL) 513 in addition to one or more INTs 511. Typically, the number of INTs 511 included in a tile depends on the height of the tile. As pictured, a BRAM tile has the same height as five CLBs, but other numbers (e.g., four) also may be used. A DSP tile 506 may include a DSP logic element (DSPL) 514 in addition to an appropriate number of INTs 511. An IOB 504 may include, for example, two instances of an I/O logic element (IOL) 515 in addition to one instance of an INT 511. The actual I/O pads connected to IOL 515 may not be confined to the area of IOL 515.

In the example pictured in FIG. 5, a columnar area near the center of the die, e.g., formed of regions 505, 507, and 508, may be used for configuration, clock, and other control logic. Horizontal areas 509 extending from this column may be used to distribute the clocks and configuration signals across the breadth of the programmable IC.

Some ICs utilizing the architecture illustrated in FIG. 5 include additional logic blocks that disrupt the regular columnar structure making up a large part of the IC. The additional logic blocks may be programmable blocks and/or dedicated circuitry. For example, a processor block depicted as PROC 510 spans several columns of CLBs and BRAMs.

In one aspect, PROC 510 may be implemented as dedicated circuitry, e.g., as a hardwired processor, that is fabricated as part of the die that implements the programmable circuitry of the IC. PROC 510 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 510 may be omitted from architecture 500 and replaced with one or more of the other varieties of the programmable blocks described. Further, such blocks may be utilized to form a "soft processor" in that the various blocks of programmable circuitry may be used to form a processor that can execute program code as is the case with PROC 510.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 5 that are external to PROC 510 such as CLBs 502 and BRAMs 503 are considered programmable circuitry of the IC.

In general, the functionality of programmable circuitry is not established until configuration data is loaded into the IC.

A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 510.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 510 or a soft processor. In some cases, architecture 500 includes a dedicated configuration processor that loads the configuration bitstream to the appropriate configuration memory and/or processor memory. The dedicated configuration processor does not execute user-specified program code. In other cases, architecture 500 may utilize PROC 510 to receive the configuration bitstream, load the configuration bitstream into appropriate configuration memory, and/or extract program code for execution.

FIG. 5 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 5 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 510 within the IC are for purposes of illustration only and are not intended as limitations.

The example embodiments described herein allow a logic analyzer to monitor a large number of signals using fewer IC resources than is the case with a conventional logic analyzer design. In one or more embodiments, data can be continuously output in VCD file format from the IC without restrictions relating to the availability of on-chip memory. Moreover, an external system such as host system executing a browser is able to view or render the VCD file without first having to translate a proprietary data format of the IC into a usable format such as one used by EDA tools.

In one or more embodiments, the time lag from capture of the probe signals to viewing of the VCD file occurs in real time (e.g., within approximately 1 second of probe signal capture). In particular embodiments, clock signals may be monitored. As such, designers are able to monitor internal signals of the IC in real time. Further, designers are able to monitor probed signals for longer time periods than in cases where probe signals are stored within the IC since the logic analyzer is not constrained by the amount of internal memory available in the IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the terms "one embodiment," "an embodiment," "one or more embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," and similar language throughout this disclosure may, but do not necessarily, all refer to the same embodiment.

As defined herein, the term "real time" means a level of processing responsiveness that a user or system senses as sufficiently immediate for a particular process or determination to be made, or that enables the processor to keep up with some external process.

As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

The term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

The flowchart and block diagrams in the Figures illustrate the architecture, functionality, and operation of possible implementations of systems and methods according to various aspects of the inventive arrangements. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods for monitoring signals in an IC. In one aspect, a method can include monitoring a probed signal of an IC using a logic analyzer circuit implemented within the IC, detecting state changes in the probed signal using the logic analyzer circuit, and generating, within the logic analyzer circuit, a file specifying time stamped state changes of the probed signal.

In an aspect, the file is specified in ASCII format.

In another aspect, the file is a value change dump file.

In another aspect, the method can also include outputting the file to an external system in substantially real time as generated.

In another aspect, the method can also include, in response to determining that a state change of the probed signal corresponds to a trigger condition, initiating a predetermined action associated with the trigger condition.

In another aspect, the method can also include providing the file to a processor within the integrated circuit, wherein the processor is configured to execute program code.

In another aspect, the method can also include providing the file to an external system, wherein the external system is configured to generate a visualization of the file.

In another aspect, generating the file includes encoding a header section, encoding a variable definition section, encoding an initial value section, and encoding a value change section.

In another aspect, the logic analyzer circuit is implemented in hardware using programmable circuitry of the integrated circuit.

One or more embodiments are directed to an IC. In one aspect, an IC includes monitored circuitry configured to generate a signal and a logic analyzer circuit. The logic analyzer circuit is configured to monitor the signal to detect state changes in the signal and generate a file specifying time stamped state changes of the signal.

In an aspect, the file is an ASCII formatted file.

In another aspect, the file is a value change dump file.

In another aspect, the logic analyzer circuit includes a trace circuitry configured to receive the signal and determine whether a current state of the signal is different from a prior state of the signal. The logic analyzer circuitry can also include a file generation circuit coupled to the trace circuitry, wherein the file generation circuit is configured to generate a file specifying time stamped state changes for the signal.

In another aspect, the trace circuitry is configured to, in response to determining that a state change of the signal corresponds to a trigger condition, initiate a predetermined action associated with the trigger condition.

In another aspect, the logic analyzer circuit includes an interface coupled to the file generation circuit.

In another aspect, the IC includes a processor coupled to the interface, wherein the processor is configured to execute program code and to receive the file.

In another aspect, the processor is configured to generate a waveform view of the monitored signal from the file.

In another aspect, the IC includes an I/O circuit coupled to the interface, wherein the I/O circuit is configured to output the file to an external system.

In another aspect, the external system generates a waveform view of the signal from the file.

In another aspect, the logic analyzer circuit is implemented in hardware using programmable circuitry of the IC.

One or more embodiments are directed to implementing an IC that includes a logic analyzer circuit. In one aspect, a method can include providing a logic analyzer circuit. The logic analyzer circuit is configured to monitor a signal to detect state changes in the signal and generate a file specifying time stamped state changes of the signal. For example, the file can be an ASCII formatted file. In a particular example, the file can be a value change dump file.

In another aspect, the method includes providing the logic analyzer circuit to include a trace circuitry configured to receive the signal and determine whether a current state of the signal is different from a prior state of the signal. Providing the logic analyzer circuit can include providing a file generation circuit coupled to the trace circuitry, wherein the file generation circuit is configured to generate a file specifying time stamped state changes for the signal.

In another aspect, the trace circuitry is configured to, in response to determining that a state change of the signal corresponds to a trigger condition, initiate a predetermined action associated with the trigger condition.

In another aspect, providing the logic analyzer circuit includes providing an interface coupled to the file generation circuit.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method for monitoring signals in an integrated circuit, comprising:
   monitoring a probed signal within the integrated circuit using a logic analyzer circuit implemented within the integrated circuit;
   detecting state changes in the probed signal using a trace circuitry in the logic analyzer circuit, wherein the trace circuitry is configured to receive the signal and determine whether a current state of the signal is different from a prior state of the signal;
   generating, by a file generation circuit in the logic analyzer circuit coupled to the trace circuitry, ASCII encoded data specifying time stamped state changes of the probed signal, wherein the file generation circuit is configured to generate a file specifying the ASCII encoded data; and providing the file, using an interface of the logic analyzer circuit coupled to the file generation circuit, to another circuit or system.

2. The method of claim 1, wherein the file does not store continuously sampled values of the probed signal.

3. The method of claim 1, wherein the file is specified as a value change dump file.

4. The method of claim 1, wherein the providing comprises:
outputting the ASCII encoded data to an external system in substantially real time as generated.

5. The method of claim 1, further comprising:
in response to determining that a state change of the probed signal corresponds to a trigger condition, initiating a predetermined action associated with the trigger condition.

6. The method of claim 1, further comprising:
providing the ASCII encoded data to a processor within the integrated circuit, wherein the processor is configured to execute program code.

7. The method of claim 1, wherein the providing comprises:
providing the ASCII encoded data to an external system, wherein the external system is configured to generate a visualization of the ASCII encoded data.

8. The method of claim 1, wherein the file generation circuit generates the file by:
encoding a header section;
encoding a variable definition section;
encoding an initial value section; and
encoding a value change section.

9. The method of claim 1, wherein the logic analyzer circuit is implemented in hardware using programmable circuitry of the integrated circuit.

10. An integrated circuit, comprising:
monitored circuitry configured to generate a signal; and
a logic analyzer circuit configured to monitor the signal to detect state changes in the signal and generate ASCII encoded data specifying time stamped state changes of the signal, wherein the logic analyzer circuit comprises:
a trace circuitry configured to receive the signal and determine whether a current state of the signal is different from a prior state of the signal;
a file generation circuit coupled to the trace circuitry, wherein the file generation circuit is configured to generate a file specifying the ASCII encoded data; and
an interface coupled to the file generation circuit.

11. The integrated circuit of claim 10, wherein the file does not store continuously sampled values of the probed signal.

12. The integrated circuit of claim 10, wherein the file is specified as a value change dump file.

13. The integrated circuit of claim 10, wherein the trace circuitry is configured to, in response to determining that a state change of the signal corresponds to a trigger condition, initiate a predetermined action associated with the trigger condition.

14. The integrated circuit of claim 10, further comprising:
a processor coupled to the interface, wherein the processor is configured to execute program code and to receive the file.

15. The integrated circuit of claim 14, wherein the processor is configured to generate a waveform view of the signal from the file on an external system coupled to the integrated circuit.

16. The integrated circuit of claim 10, further comprising:
an input/output circuit coupled to the interface, wherein the input/output circuit is configured to output the file to an external system.

17. The integrated circuit of claim 16, wherein the external system generates a waveform view of the signal from the file.

18. The integrated circuit of claim 10, wherein the logic analyzer circuit is implemented in hardware using programmable circuitry of the integrated circuit.

* * * * *